METHOD OF ACCURATELY DOPING A SEMICONDUCTOR MATERIAL LAYER

Filed July 15, 1968

INVENTOR
JOHN L. JANNING
Louis A Kline
BY John J. Callahan
John F. Tarlano
HIS ATTORNEYS United States Patent Office 3,616,527
Patented Nov. 2, 1971

3,616,527

METHOD OF ACCURATELY DOPING A SEMICONDUCTOR MATERIAL LAYER

John L. Janning, Dayton, Ohio, assignor to The National Cash Register Company, Dayton, Ohio Filed July 15, 1968, Ser. No. 744,991
Int. Cl. B01j 17/34
U.S. Cl. 29—571 1 Claim

ABSTRACT OF THE DISCLOSURE

The present invention relates to a method of accurately doping a semiconductor material layer so as to control the electrical conductivity of said doped semiconductor material layer, such as a doped semiconductor material layer within a thin film insulated gate field effect semiconductor device, by depositing a thin film of dopant atoms upon a substrate, as between a source electrode layer and a drain electrode layer which are upon a substrate, and evaporating said semiconductor material layer upon said thin film of dopant atoms.

BACKGROUND OF THE INVENTION

In the prior art is a method of doping a semiconductor material layer, such as a semiconductor material layer of a thin film insulated gate field effect semiconductor device, by simultaneously evaporating dopant material from a semiconductor material-dopant mixture within a single container having said dopant material and semiconductor material therein, or simultaneously from two containers, one containing said dopant material, the other containing said semiconductor material. Such simultaneous evaporation requires very accurate control of the temperature, for evaporation, of each of said two containers relative to the other container, so as to dope the semiconductor material to a desired known value. A semiconductor material-dopant mixture does not have an easily known temperature for evaporation, so as to maintain the concentrations of a semiconductor material and a dopant material in a known ratio.

In the method of the present invention, a desired concentration ratio may be accurately arrived at by depositing a known thickness of a thin film of dopant atoms upon a substrate, said film thickness being adjusted so as to form, in a subsequently evaporated known thickness of a semiconductor material layer, a known concentration ratio. By using a step-wise method, the thickness of the film of dopant atoms is known, and the thickness of the semiconductor material is known. Uncontrollable doping of a thin film insulated gate field effect semiconductor device is thus eliminated by the method of the present invention. The method of the present invention, therefore, allows a technique for accurately controlling the concentration ratio of dopant atoms to a semiconductor material within a doped semiconductor material layer, by placing a known thickness of a thin film of dopant atoms upon a substrate, and evaporating a known thickness of a semiconductor material layer upon said thin film of dopant atoms.

SUMMARY OF THE PRESENT INVENTION

The present invention comprises a method of controlling the concentration ratio of dopant material to semiconductor material, within a doped semiconductor material layer, comprising depositing a known thickness of a thin film of dopant atoms upon a substrate, and evaporating a known thickness of a semiconductor material layer upon said thin film dopant atoms.

DESCRIPTION OF THE PREFERRED EMBODIMENT

Figure 1:
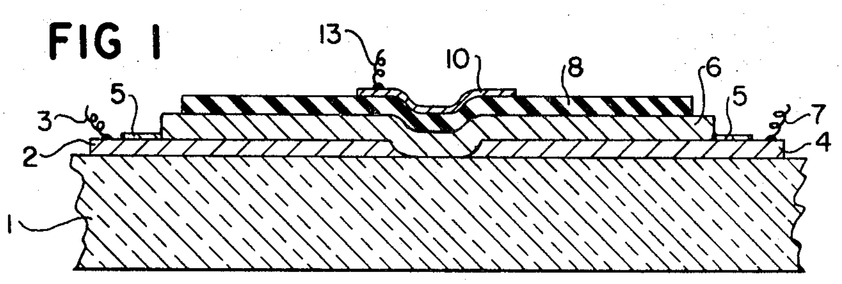
FIG. 1 is a plan view of a thin film insulated gate field effect semiconductor device into which is incorporated a thin film of dopant atoms.

As shown in FIG. 1, a one-micron-thick cadmium selenide semiconductor material layer 6 may be doped with a concentration ratio of 0.034%, by weight, of copper atoms, by depositing upon a substrate 1, such as a glass substrate 1, a 2.19-angstrom-thick film of copper atoms 5, and thereafter evaporating a one-micron-thick cadmium selenide semiconductor material layer 6. Other semiconductor materials, such as cadmium sulfide, and other doping materials, such as gold or silver, may be used. A 2.19-angstrom copper film 5 will cause a one-micron cadmium selenide semiconductor material layer 6, which normally has a resistance of 25 megohms per square, to have an increased resistance of 125,000 megohms per square, due to the doping of said cadmium selenide semiconductor material layer 6, with said thin film of copper atoms. The copper atoms are absorbed into the cadmium selenide during the evaporation of the cadmium selenide semiconductor material layer 6 onto the copper film 5.

FIG. 1 shows the application of the method of the present invention to the fabrication of an insulated gate field effect semiconductor device, so as to increase the transconductance of said insulated gate field effect semiconductor device.

On one side of said glass substrate 1 are deposited a source electrode layer 2 and a drain electrode layer 4, such as a gold source electrode layer 2 and a gold drain electrode layer 4, as by vacuum deposition. The gold source electrode layer 2 and the gold drain electrode layer 4 are separated, as by a distance of 10 microns. Said substrate, however, may be of any other insulating material, such as ceramic, porcelain, thermal plastic, or other non-conducting material, as well as glass.

A thin film of copper atoms 5 is deposited between said source electrode layer 2 and said drain electrode layer 4, as by evaporation from the fixed quantity of copper. As shown in FIG. 1, a 2.19-angstrom thin film of copper atoms 5 was evaporated between said source electrode layer 2 and said drain electrode layer 4. Thereafter, a one-micron semiconductor material layer 6, such as cadmium selenide semiconductor material layer 6, was evaporated upon said 2.19-angstrom film of copper atoms 5 to produce a concentration ratio of 0.034% on said cadmium selenide semiconductor material layer 6. Cadmium selenide is normally n-type for an electronic grade, so that the copper atoms 5 are absorbed to act as acceptor atoms, thus increasing the electrical resistivity of the cadmium selenide semiconductor material layer 6. The copper atoms 5 also compensate for donor atoms which are normally present on even the most well prepared substrate 1. It is found that a concentration ratio greater than 0.15% will require too high of a threshold voltage for turning on the thin film insulated gate field effect semiconductor device of FIG. 1.

The resistance of a semiconductor material layer 6 of a nearly identical insulated gate field effect semiconductor device of FIG. 1, except for the 2.19-angstrom thin film of copper atoms 5, is 0.1 megohm. The insulated gate field effect semiconductor device, as shown in FIG.

1, has an increased resistance of 500 megohms. This 5,000 times increase is due to a concentration ratio of 0.034%. A larger concentration ratio will give a larger factor than 5,000. This increase in resistance thereby increases the transconductance or gain of said insulated gate field effect semiconductor device.

The insulated gate field effect semiconductor device of FIG. 1 is completed by evaporating an insulator layer 8, such as a 0.1-micron-thick silicon monoxide insulator layer 8, upon said semiconductor material layer 6. A gate electrode layer 10, such as a 0.1-micron-thick aluminum gate electrode layer 10, is evaporated upon said silicon monoxide insulator layer 8. An electrode lead wire 13, such as a copper electrode lead wire 13, is attached to the aluminum gate electrode layer 10, by means of silver conductive paint. Electrode lead wires 3 and 7, such as copper electrode lead wires, are attached respectively to said source electrode layer 2 and said drain electrode layer 4, by means of silver conductive paint.

Figure 2:
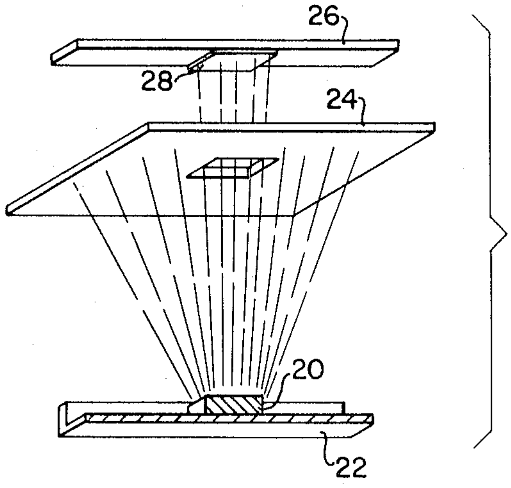
FIG. 2 is a perspective view of an arrangement for depositing a layer of dopant atoms on an evaporation strip.
Figure 3:
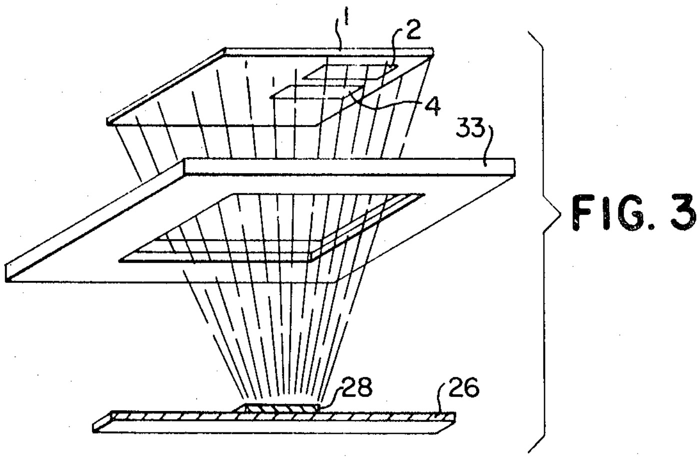
FIG. 3 is a perspective view of an arrangement for evaporating a thin film of dopant atoms on a substrate.

FIGS. 2 and 3 show a method of accurately controlling the thickness of said thin film of dopant atoms 5, which is used to dope said semiconductor material layer 6. As shown in FIG. 2, a measurable amount of copper 20, such as 0.080 gram of copper, is placed within an evaporation boat 22, such as a tantalum boat 22, for evaporation of a layer of copper 28, which intermediate layer of copper 28 is used to deposit said 2.19-angstrom-thick film of copper 5. When the tantalum boat 22 is heated sufficiently, copper evaporates upwardly in a hemispheric pattern. The mask 24 decreases the amount of copper 20 from 0.080 gram, by evaporating copper 20 through a one-centimeter-square hole in the mask 24 onto a tantalum evaporation strip 26. The tantalum evaporation strip 26 is 17.5 centimeters above the tantalum boat 22, producing a uniform layer of copper 28 on the tantalum evaportaion strip 26. The layer of copper 28 is measured and is found to be 1400 A. thick, and has an area of one square centimeter. Since the density of copper is 8.94, the weight of the layer of copper 28 is 0.000125 gram, and the vacuum-system-fixed percentage is 0.001562. Said tantalum evaporation strip 26, if used as a diffusion source, will produce a 2.19-angstrom thin film of copper atoms 5 on the substrate 1, due to this vacuum-system-fixed percentage. In FIG. 3, said tantalum evaporation strip 26 is substituted for the tantalum boat 22. A substrate 1 with a source electrode layer 2 and a drain electrode layer 4 deposited thereon is placed in an inverted position over the tantalum evaporation strip 26, 17.5 centimeters above said strip 26, so that a 2.19-angstrom film of copper 5 may be evaporated between said source electrode layer 2 and said drain electrode layer 4 from the layer of copper 28. The tantalum evaporation strip 26 is electrically heated so as to evaporate the layer of copper 28, which has been evaporated thereon, from said strip 26.

What is claimed is:

1. A method of producing a thin film insulated gate field effect semiconductor device, comprising:
   - (a) depositing a source electrode layer and a drain electrode layer in close proximity to one another, upon an insulative substrate;
   - (b) depositing a specified thickness thin film p-type dopant material in the order of about 2 angstroms upon said substrate between said source electrode layer and said drain electrode layer;
   - (c) evaporating an n-type semiconductor material upon said film of p-type dopant material, said film of dopant material being thin enough so that substantially the whole of this p-type dopant material is absorbed into the n-type semiconductor material to produce a counterdoped n-type semiconductor layer having a thickness of approximately 10,000 angstroms and an increased resistance;
   - (d) depositing an insulator layer on the counterdoped semiconductor material which lies between the source and drain electrodes; and
   - (e) depositing a metal gate electrode on said insulator layer.

References Cited

UNITED STATES PATENTS

| | | | |
|---|---|---|---|
| 2,898,226 | 8/1959 | Evans et al. | 117—106 X |
| 3,218,204 | 11/1965 | Ruehrwein | 117—106 X |
| 3,260,902 | 7/1966 | Porter | 317—235 |
| 3,385,731 | 5/1968 | Weimer | 117—106 X |
| 3,409,464 | 11/1968 | Shiozawa | 117—106 X |
| 3,470,610 | 10/1969 | Breitweiser | 317—235 |
| 3,149,395 | 9/1964 | Bray et al. | 29—25.3 |

ALFRED L. LEAVITT, Primary Examiner

C. K. WEIFFENBACH, Assistant Examiner

U.S. Cl. X.R.

29—579; 117—215, 217, 106, 107; 148—174, 191; 317—235 B